United States Patent
Nishida et al.

(10) Patent No.: US 6,827,639 B2
(45) Date of Patent: Dec. 7, 2004

(54) POLISHING PARTICLES AND A POLISHING AGENT

(75) Inventors: Hiroyasu Nishida, Fukuoka-ken (JP); Yoshinori Wakamiya, Fukuoka-ken (JP); Michio Komatsu, Fukuoka-ken (JP)

(73) Assignee: Catalysts & Chemicals Industries Co., Ltd., Kawasaki (JP)

( * ) Notice: Subject to any disclaimer, the term of this patent is extended or adjusted under 35 U.S.C. 154(b) by 11 days.

(21) Appl. No.: 10/394,217

(22) Filed: Mar. 24, 2003

(65) Prior Publication Data

US 2003/0186634 A1 Oct. 2, 2003

(30) Foreign Application Priority Data

Mar. 27, 2002 (JP) .......................................... 2002-087740

(51) Int. Cl.⁷ .............................................. B24B 47/02
(52) U.S. Cl. .......................... 451/330; 451/36; 451/41; 451/56; 451/60; 451/287; 451/443; 246/36
(58) Field of Search ............................ 451/330, 36, 41, 451/56, 60, 287, 443; 264/36

(56) References Cited

U.S. PATENT DOCUMENTS 4,054,536 A * 10/1977 Schaefer et al. ............... 516/81
5,334,335 A *  8/1994 Norville ...................... 264/36.1
6,328,634 B1 * 12/2001 Shen et al. .................... 451/41
6,328,944 B1 * 12/2001 Mangold et al. ............. 423/278

FOREIGN PATENT DOCUMENTS

JP        11-302635       11/1999

* cited by examiner

*Primary Examiner*—Joseph J. Hail, III
*Assistant Examiner*—Alvin J Grant
(74) *Attorney, Agent, or Firm*—Manabu Kanesaka

(57) ABSTRACT

In polishing particles each having a core-shell structure, a polishing rate can be controlled by adjusting a thickness and/or density of a shell portion. The polishing particles have the core-shell structure with an average diameter in the range from 5 to 300 nm, and the shell portion of the polishing particles includes silica with a thickness in the range from 1 to 50 nm. A density of the shell portion is in the from 1.6 to 2.2 g/cc, while the Na content of the shell portion is less than 10 ppm.

9 Claims, No Drawings

POLISHING PARTICLES AND A POLISHING AGENT

TECHNICAL FIELD

The present invention relates to polishing particles each having a core-shell structure and a polishing agent including the polishing particles.

BACKGROUND TECHNOLOGY

In the manufacture of semiconductor substrates each with an integrated circuit formed thereon based on the conventional technology, as irregularities or steps are generated on a silicon wafer when a circuit is formed With metal such as copper, and the metallic portions of the circuit are preferentially removed so that the steps on the wafer surface can be eliminated by polishing. When an aluminum wiring is formed on a silicon wafer and an oxide film made of, for instance, $SiO_2$ as an insulating film is provided on the aluminum wiring, also irregularities due to the wiring are generated, and therefore the oxide film is polished fee in order to flatten it.

As a polishing method employed for the purposes as described above, the chemical mechanical polishing method (sometimes described as CMP hereinafter) is well known. In the method, a substrate with irregularities thereon is pressed to a rotating polishing pad, and the substrate itself is rotated and steeped into a polishing agent slurry together with the polishing pad. In this state, polishing particles included in the slurry are pressed because of the weight to the substrate having irregularities thereon, and as a result, the convex metallic portions of the substrate are removed and flattened. Further, for flattening a surface of an oxide film formed on a substrate, polishing is performed in a similar manner also for removing the irregularities of the insulating film (oxide film) formed on the circuit or for other purposes.

In this polishing step, spherical particles made of fumed alumina or fumed silica with the average particle diameter of about 200 nm are generally used as the polishing particles. As the polishing agent, an oxidizing agent such as hydrogen peroxide for improving the polishing rate for metal, benzotriazole (BTA) for suppressing corrosion or oxidization of metal, chemical polishing agents such as acids, or aqueous polishing agent slurry with a pH adjusting agent added therein are used together with the polishing particles as described above.

In polishing the substrates as described above, it is required that a surface of the substrate having been subjected to polishing is flat without any irregularity, step, or micro flaw, and further the polishing rate is required to be high. Further a degree of integration in the semiconductor materials has been becoming increasingly higher in association with the tendency for electric or electronic products with smaller size and higher performance, but if impurities remain, for instance, on a separation layer of a transistor, the required performance may not be achieved, or failures may occur. Especially when any alkali metal, especially Na is deposited on a surface of a polished semiconductor substrate or a polished oxide film, the alkali metal easily diffuses and is captured in defects of the oxide film or other sections, which may in turn result, when a circuit is formed on the semiconductor substrate, insulation fault or short circuit on the circuit with the dielectric constant dropped.

Because of the phenomena, the faults or failures may occur when the semiconductor substrate is used for a long period of time under the varying various conditions.

Japanese Patent Laid-open Publication No. HEI 11-302635 discloses, based on the finding that colloid including fine silica particles each covered with aluminum is more stable in the high alkali region as compared to the ordinary colloidal silica including the fine silica particles not covered with aluminum, use of a solution which is a colloid including fine silica particles each covered with aluminum and has a pH buffering activity and a high dielectric constant as a solution of a composition for polishing. Further the publication also includes the description that pH of the composition for polishing little changes in the high pH region and the polishing machining rate is high and stable.

DISCLOSURE OF THE INVENTION

The present invention was made to solve the problems as described above, and it is an object of the present invention to provide polishing particles making it possible to control a polishing rate by adjusting a thickness and/or density of a shell portion of polishing particles each having a core-shell structure for the purpose of solving the problems described above, and to provide a polishing agent including the polishing particles.

The polishing particles according to the present invention have a core-shell structure with an average particle diameter (D) in the range from 5 to 300 nm, and a shell portion of the polishing particles comprises silica with a thickness ($S_T$) in the range from 1 to 50 nm.

A density of the shell portion is preferably in the range from 1.6 to 2.2 g/cc.

An Na content in the shell portion is preferably not more than 10 ppm.

A core portion preferably comprises one, two or more oxides selected from the group consisting of $SiO_2$, $Al_2O_3$, $ZrO_2$, $SnO_2$, $ZnO$, $CeO_2$, $TiO_2$, and $MnO$.

The polishing agent according to the present invention comprises the polishing particles described above.

BEST MODE FOR CARRYING OUT THE INVENTION

Preferred embodiments of the present invention are described below.

(1) Polishing particles

Each of the polishing particles according to the present invention has a core-shell structure with the average particle y diameter (D) in the range from 5 to 300 nm, preferably in the range from 10 to 200 nm, and more preferably in the range from 10 to 45 nm. When the average particle diameter is less than 5 nm, a dispersion liquid of the polishing particles or a polishing agent may be unstable, and further the particle diameter is too small to obtain a sufficient polishing rate. On the other hand, when the average particle diameter is more than 300 nm, scratches may occur in some types of substrates or insulating films, which may in turn make it impossible to achieve the sufficient smoothness. Therefore the average diameter of the polishing particles should preferably be selected within the ranges described above taking into considerations such factors as a required polishing rate and polishing precision.

The shell portion of the polishing particles comprises silica, and the thickness ($S_T$) of the shell portion is in the range from 1 to 50 nm, preferably in the range from 2 to 30 nm, and more preferably in the range from 5 to 26 nm. When the thickness ($S_T$) of the shell portion is less than 1 nm, the effect of providing the shell portion can hardly be achieved. Namely, even when the alkali metal content in the core portion is high, sometimes it is impossible to prevent dispersion of the alkali metal to outside of the particles and to obtain the effect of, for instance, adjusting the polishing rate provided by the polishing agent by changing the density of the shell portion. When the thickness ($S_T$) of the shell portion is even over 50 nm, the effects described above are not further enhanced, and although the circumstances vary according to a particle diameter of the core portion, the case is not different from a case where polishing particles each substantially comprising only the shell portion are prepared, and sometimes it is economically not advantageous. Generally the ratio of the thickness ($S_T$) of the shell portion vs the average particle diameter (D) of the polishing particles (($S_T$)/(D)) should preferably be in the range from $1/100$ to $1/2$.

The density of the shell portion is preferably in the range from 1.6 to 2.2 g/cc, and more preferably in the range from 1.8 to 2.2 g/cc. As described above, in the present invention, as the shell portion comprises silica, the density is not more than 2.2 g/cc. When the density of the shell portion is less than 1.6 g/cc, the strength of the shell portion lowers and the shell portion is sometimes separated or broken during polishing, which may in turn result scratches. By changing the density of the shell portion within the range described above, the polishing rate and smoothness of the polished surface can be controlled, and when the density of the shell portion is high, the polishing rate can be made higher, and on the other hand, when the density of the shell portion is low, it is possible to lower the polishing rate or to eliminate scratches on and flatten the polished surface.

To measure the density (Ds) of the shell portion, at first the density (Dc) of the core particles is measured according to the pyonometer method, and then the Z-contrast (Zc) (strength per unit thickness: cps) of the core particles is measured with a scanning transmission of electron microscope (STEM). Then the Z-contrast (Zs) (strength per unit thickness: cps) of the shell portion of the polishing particles is measured with the STEM, and the density (Ds) is calculated according to the equation of Ds=Dc×Zs/Zc.

The Na content in the shell portion as calculated as a content of Na element therein is not more than 10 ppm, preferably not more than 5 ppm, and more preferably not more than 1 ppm. When the Na content is over 10 ppm, Na remains on a surface of the polished substrate, and sometimes insulation fault or short circuit may occur in a circuit formed on the semiconductor substrate, which may in turn cause drop of the dielectric constant in a film (insulating film) and increase of impedance in the metal wiring, and in that case such disadvantageous phenomena as delay in the response rate and increase of power consumption occur. Further the Na ions diffuse, and when the semiconductor substrate is used for a long time or conditions for use thereof change, the troubles as described above may occur.

(2) Core particles

The core portion of the polishing particles according to the present invention should preferably comprises one, two, or more oxides selected from the group consisting of $SiO_2$, $Al_2O_3$, $ZrO_2$, $SnO_2$, ZnO, $CeO_2$, $TiO_2$, and MnO, and the component(s) may be selected according to a type of a substrate to be polished, a required polishing rate or polishing precision, and other related factors. It is to be noted that the Na content in the core portion is not restricted to not more than 10 ppm in the present invention. Although the circumstances vary according to the thickness of the shell portion, when the density of the shell portion is, for instance, in the range from 2.0 to 2.2, the density of the shell portion is sufficiently high for preventing Na from diffusing from the shell portion to the outside. The core portion should preferably comprises spherical particles, and the average particle diameter of the core particles is preferably in the range from 4 to 250 nm.

The polishing particles according to the present invention can be dissolved in water and/or an organic solvent for use. The organic solve nt preferably available for this purpose includes alcohols such as methyl alcohol, ethyl alcohol, an d isopropyl alcohol, and water-soluble organic solvents such as ethers, esters, and ketones may also be used for this purpose. The concentration of the dispersion liquid of the polishing particles is preferably in the range from about 5 to about 50% by weight. When the concentration is less than 5 weight %, the concentration of the polishing particles in the polishing agent which can be obtained by blending the particles and solvent is too low to obtain a sufficient polishing rate, and on the other hand when the concentration of the dispersion liquid is over 50% by weight, the stability of the dispersion liquid generally becomes lower, and sometimes dry materials are generated and deposited on a surface of the polished substrate during the process of supplying a dispersion liquid for polishing, which may in turn generate scratches.

(3) Method of Preparing the Polishing Particles

The method of preparing the polishing particles described above is described below.

At first, a dispersion liquid of the core particles described above is prepared, and silica is precipitated by adding an acidic silicic acid solution to the dispersion liquid to form the shell.

The concentration of the core particles in the dispersion liquid is preferably in the range from 0.005 to 20% by weight, and more preferably in the range from 0.01 to 10% by weight as calculated as that of the oxide. When the concentration of the core particles is less than 0.005% by weight, the productivity is low, and when the concentration of the core particles is over 20 weight %, the density of the shell portion may sometimes be less than 1.6 although the situation changes according to the quantity of the added acidic silicic acid solution, and further the obtained polishing particles may be agglutinated. Further the temperature of the dispersion liquid is preferably in the range from 50 to 200° C., and more preferably in the range from 80 to 150° C.

The acidic silicic acid solution available for this purpose includes (1) an acidic silicic acid solution obtained by de-alkalizing an aqueous solution of an alkali metal silicate with an ion-exchange resin or the like, (2) an acidic silicic acid solution obtained by hydrolizing an organic silicon compound with an acid such as hydrochloric acid, nitric acid, and sulfuric acid, (3) the conventionally known acidic silicic acid solution obtained by de-alkalizing or removing an organic base from an aqueous solution obtained by adding an organic silicide to an aqueous solution of an alkali metal hydroxide and/or an aqueous solution of an organic base. As an alkali of the alkali metal silicate aqueous solution or the alkali metal hydroxide aqueous solution, an alkali other than Na, especially K is preferable, and Na is substantially not present in the acidic silicic acid solution obtained in this case, so that the particles substantially containing no Na in the shell portion can be obtained.

As the organic silicide, an organic silicide expressed by the following chemical formula or a mixture thereof can be used:

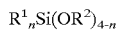

wherein $R^1$ indicates a hydrocarbon group containing 1 to 10 carbon atoms selected from the group of substituted or non-substituted hydrocarbon groups; $R^2$ indicates a hydrogen atom, an alkyl group containing 1 to 5 carbon atoms or acyl group containing 2 to 5 carbon atoms; and n indicates an integral number of 0 or 1.

In the chemical formula, as the organic silicide, in which n is equal to 0, has no hydrocarbon groups directly bonded to silicon, the density of the obtained shell portion insures the high polishing rate when the material is used for polishing. Specifically the organic silicide includes organic suicides having four functional groups such as tetraethoxysilane (TEOS), tetramethoxysilane (TMOS), tetrapropoxysilane(TPOS), and tetrabutoxysilane (TBOS).

As the alkali metal hydroxide aqueous solution, LiOH, NaOH, KOH, RbOH, CsOH and a mixture thereof may be used, and generally a KOH aqueous solution is advantageously used. As the organic base aqueous solution, quarternary ammonium hydroxide is preferable, and also any of tetramethyl ammonium hydroxide, tetraethyl ammonium hydroxide, and tetrapropyl ammonium hydroxide is preferable.

As for a quantity of the organic silicide added to the alkali metal hydroxide aqueous solution and/or the organic base aqueous solution, the concentration in the aqueous solution is preferably in the range from 1 to 10% by weight, and more preferably in the range from 2 to 7% by weight as calculated as $SiO_2$. When the addition rate is less than 1% by weight as converted to $SiO_2$, sometimes such phenomena as hydrolysis and oligomerization of the silicic acid occur, and a silicic acid solution with a low silicic acid monomer content as well as with a high silicate oligomer content may be obtained in the subsequent de-cation step. The density of the shell obtained by using the acidic silicic acid solution as described above is low, and when the particles are used for polishing, sometimes the polishing rate may drop. When a quantity of the added organic silicide as converted to $SiO_2$ is over 10% by weight, viscosity of the obtained alkali metal silicate aqueous solution and/or organic basic silicic acid aqueous solution is high, and it is difficult to remove alkali cations and/or organic cations with ion-exchange resin in the downstream process, and further, the obtained acidic silicic acid solution is poor in its stability and sometimes gelatinized.

The concentration of the acidic silicic acid solution as converted to $SiO_2$ is in the range from 1 to 10% by weight, and more preferably in the range from 2 to 7% by weight pH of the silicic acid solution is preferably in the range from 1 to 5.0, and more preferably in the range from 1.5 to 4.0. Especially, when pH of the silicic acid solution is in the range from 1.5 to 4.0, cations remaining in the acidic silicic acid solution are few, and its stability is excellent Then, while keeping the temperature of the dispersion liquid of the core particles in the range from 50 to 200° C. and more preferably in the range from 60 to 150° C., the acidic silicic acid solution is added continuously or intermittently to the dispersion liquid to form the shell. The addition rate of the acidic silicic acid solution varies according to the average particle diameter or density of the core particles in the dispersion liquid, and generally may be changed in proportion to the total external surface area of the core particles. If the addition rate of the acidic silicic acid solution too high, the shell density may drop to even less than 1.6 Further the acidic silicic acid solution may be added once or repeatedly until a shell with the desired thickness is formed.

After the acidic silicic acid solution is added, the resultant mixture solution may be aged for 0.5 to 5 hours at the temperature in the range from 70 to 150° C., if necessary. By aging the resultant mixture solution, it is possible to form a shell portion with the high density of the particles therein. After addition of the acidic silicic acid solution and/or aging of the resultant mixture solution, it is possible to obtain a dispersion liquid of the polishing particles by removing ions with an ultrafiltration film or by condensing or diluting the solution to the desired density. Further it is possible to obtain a dispersion liquid of the polishing particles in which the water solvent is substituted with the organic solvent described above by the ultrafiltration method or distillation method.

The Na content in the shell portion of the particles obtained as described above is less than 10 ppm.

(4) Polishing agent f.

The polishing agent, according to the present invention comprises the polishing particles described above. The polishing particles may be used as they are, and also may be used as a dispersion liquid in which the particles are dispersed, if necessary. As the dispersion medium, generally water is used, but alcohols such as methyl alcohol, ethyl alcohol, and isopropyl alcohol, or organic solvents such as ethers, esters, and ketones may be used.

The concentration of the polishing particles in the polishing agent should preferably be in the range from 5 to 50% by weight, and more preferably it the range from 5 to 30% by weight. When the concentration is less than 5% by weight, the concentration is too low for some types of substrates or insulating films, and the polishing rate is too low, which may in turn result in low productivity. On the other hand, when the density is over 50% by weight, stability of the polishing agent becomes insufficient with the polishing rate or the polishing efficiency not further improved, and dry materials may be generated and deposited during the step of supplying the dispersion liquid during the polishing process, which may in turn generate scratches.

In the polishing agent according to the present invention, any of hydrogen peroxide, peracetic acid, urea peroxide, and a mixture thereof, each of which has been well known, may be used according to a type of substrate to be polished, if necessary. When any of hydrogen peroxide or other materials is added, the polishing precision can effectively be improved when the substrate to be polished is a metallic one. Further organic acids such as phthalic acid and citric acid or organic salts thereof may be added as a complex formation agent. In addition, pH of the polishing agent can be adjusted for suppressing oxidation by using benzotriazole (BTA) or the like or by using an acid or a base.

A surfactant may be added to improve the dispersibility or stability of the polishing agent.

The particles according to the present invention each has the shell portion comprising silica and having the pre-specified thickness, and by adjusting the thickness, it is possible to obtain the polishing particles capable of insuring the desired polishing rate and the polishing agent comprising the particles. Especially by controlling the density of the shell portion within the range from 1.6 to 2.2 g/cc, it is possible to obtain the polishing particles capable of insuring, in addition to the desired polishing rate, the desired polishing precision enough to provide a smooth polished surface without any scratch.

Further by controlling the Na content in the shell portion at 10 ppm or below, the possibility that Na remains on a semiconductor substrate or the like polished with the polishing particles and the polishing agent containing the particles is eliminated.

EXAMPLES

Example 1

Preparation of a Dispersion Liquid of Polishing Particles (A)

Ortho-ethyl silicate (produced by TAMAKAGAKU K.K, Na content: 0.01 ppm) was dissolved in KOH to obtain a potassium silicate aqueous solution (concentration of $SiO_2$: 21% by weight, $SiO_2/K_2O$ molar ratio=3.5). The diluted water glass (concentration of $SiO_2$: 5% by weight) obtained by diluting the resultant mixture solution above was dealkalized with ion-exchange resin to prepare 4050 grams of acidic silicic acid solution (pH 2.2, $SiO_2$ concentration: 3% by weight).

500 grams of core particle dispersion liquid with the $SiO_2$ concentration of 5% by weight obtained by diluting a silica sol (produced by CClC, SI-50, average particle diameter: 25 nm, $SiO_2$ concentration: 48% by weight, Na content: 0.37 weight %) m was heated to 83° C., and pH of the dispersion liquid was adjusted to 10.5 by adding KOH aqueous solution with the concentration of 20% by weight. Then 4025 grams of the acidic silicic acid solution described above was added to the dispersion liquid for 17 hours to form the shell, aged for one washed with a an ultrafiltration film until pH of the silica particle dispersion liquid was adjusted to 10, and then condensed by removing alcohols by means of distillation at the raised temperature to obtain a silica particle dispersion liquid with the $SiO_2$ concentration of 20% by weight.

Then the silica particle dispersion liquid was ion-exchanged with ion-exchange resin to prepare the dispersion liquid of polishing particles (A) with the $SiO_2$ concentration of 20% by weight The resultant polishing particles (A) were analyzed for Na and K contents in the particles. The Na content in the shell portion was calculated from the Na contents in the core particles as well as in the obtained silica particles, and the average particle diameter and the density of the shell portion were measured. A result of the measurement is shown in Table 1.

Preparation of a Polishing Agent (A)

The pH of the dispersion liquid was adjusted to 10.5 by adding an aqueous solution of $NH_4OH$ with the concentration of 15% by weight into the dispersion liquid of polishing particles (A) with the $SiO_2$ concentration of 20% by weight obtained in the process above, then the polishing agent (A) was prepared.

Polishing

A silicon wafer (for polishing test, 30 mm□) with a thermally oxidized film formed thereon as a substrate to be polished was set in a polishing device (produced by Nanofactor (K.K): NF300), and the silicon wafer was polished supplying for 0.30 seconds the polishing agent (A) under the following conditions; a substrate load: 0.12 MPa, the rotating rate of the table: 30 rpm, and the flow rate of the polishing agent (A): 1 ml/sec. Thicknesses of the substrate before and after polishing were measured to calculate the polishing rate, and further smoothness of the substrate before and after polishing was assessed. A result of the assessment is shown in Table 1. The smoothness was assessed by observing a surface of the polished silicon wafer with an optical microscope, and assessment was performed based on the following criteria.

○: Almost all of scratches, lines, and other damages observed before polishing were eliminated and a smooth surface was provided.

Δ: Scratches, lines, and other types of damages observed before polishing were reduced to a half or below, and a smooth surface was provided.

x: Scratches, lines, and other types of damages observed before polishing were a little reduced, but the surface was rough.

Example 2

Preparation of a Dispersion Liquid of Polishing Particles (B) and a Polishing Agent (B)

An aqueous solution ($SiO_2$ concentration: 3% by weight temperature: 50° C.) of ortho-methyl silicate (produced by TAMAKAGAKU K. K, Na content 0.01 ppm) was hydrolised by adding hydrochloric acid therein to prepare 4100 grams of acidic silicic acid solution (pH 2.2, $SiO_2$ concentration: 3% by weight). A dispersion liquid of polishing particles (B) with the $SiO_2$ concentration of 20% by weight was prepared by following the same procedure in Example 1 excepting the fact that the acidic silicic acid olution described above was used.

The polishing agent (B) was prepared by following the procedure in Example 1 excepting the fact that the dispersion liquid of polishing particles (B) was used, and polishing testing was carried out by using the polishing agent (B).

Example 3

Preparation of a Dispersion Liquid of Polishing Particles (C) and a Polishing Agent (C)

A diluted water glass (with the $SiO_2$ concentration of 5% by weight) obtained by diluting water glass (produced by DOKAI KAGAKU (K. K.), Water Glass JIS No. 3. $SiO_2$ concentration: 24% by weight) was dealkalized with ion-exchange resin to prepare 4050 grams of acidic silicic acid solution (pH 2.2, $SiO_2$ concentration: 3% by weight). A dispersion liquid of polishing particles (C) with the $SiO_2$ concentration of 20% by weight was prepared by following the procedure in Example 1 excepting the fact that the acidic silicic acid solution described above was used.

The polishing agent (C) was prepared by following the procedure in Example 1 excepting the fact that the dispersion liquid of polishing particles (C) described above was used, and polishing testing was carried out by using the polishing agent (C).

Example 4
Preparation of a Dispersion Liquid of Polishing Particles (D) and a Polishing Agent (D)

A dispersion liquid of polishing particles (D) with the $SiO_2$ concentration of 20% by weight was prepared by following the procedure in Example 1 excepting the fact that the a silica sol (produced by CCIC, Cataloid SI-45P, average particle diameter: 45 nm, $SiO_2$ concentration of 40% by weight, Na content: 0.30% by weight) was used. The polishing agent (D) was prepared by following the procedure in Example 1 excepting the fact that the dispersion liquid of polishing particles (D) described above was used, and polishing testing was carried out by using the polishing agent (D).

Example 5
Preparation of a Dispersion Liquid of Polishing Particles (E) and a Polishing Agent (E)

A dispersion liquid of polishing particles (E) with the $SiO_2$ concentration of 20% by weight was prepared by following the procedure in Example 4 expecting the fact that 8000 grams of an acidic silicic acid solution was added over 34 hours. The polishing agent (E) was prepared by following the procedure in Example 1 excepting the fact that the dispersion liquid of polishing particles (E) described above was used, and polishing testing was carried out by using the polishing agent (E).

Example 6
Preparation of a Dispersion Liquid of Polishing Particles (F) and a Polishing Agent (F)

A dispersion liquid of polishing particles (F) with the titania-silica concentration of 20% by weight was prepared by following the procedure in Example 1 excepting the fact that a titania sol (produced by OCIC, Neosunvale PW-1010, average particle diameter: 10 nm, $TiO_2$ concentration: 10% by weight, Na content 0.01% by weight) was used as a dispersion liquid of core particles. The polishing agent (F) was prepared by following the procedure in Example 1 excepting the fact that the dispersion liquid of polishing particles (F) described above was used, and polishing testing was carried out by using the polishing agent (F).

Comparative Example 1

Preparation of a Polishing Agent (G)

A silica sol (produced by CCIC, SI-50, average particle diameter 25 nm, $SiO_2$ concentration: 48% by weight, Na content 0.37% by weight) was diluted to the $SiO_2$ concentration of 20% by weight and an aqueous solution of $NH_4OH$ with the concentration of 15% by weight was added to the diluted silica Sol to prepare a polishing agent (G) comprising the dispersion liquid with the pH of 10.5. Polishing testing was performed for the polishing agent (G).

Comparative Example 2
Preparation of a Polishing Agent (H)

A silica sol (produced by CCIC, SI-45P, average particle diameter: 45 nm, $SiO_2$ concentration: 40% by weight, Na content: 0.30% by weight) was diluted to the $SiO_2$ concentration of 20% by weight, and then an aqueous solution of $NH_4OH$ with the concentration of 15% by weight was added to the diluted silica so to prepare a polishing agent (H) comprising the dispersion liquid with the pH of 10.5. Polishing testing was performed for the polishing agent (H).

Comparative Example 3
Preparation of a Dispersion Liquid of Polishing Particles (I) and a Polishing Agent (I)

A dispersion liquid of polishing particles (1) with the $SiO_2$ concentration of 20% by weight was prepared by following the procedure in Example 1 excepting the fact that the acidic silicic acid solution was added over 3 hours. A polishing agent (I) was prepared by following the procedure in Example 1 excepting the fact that the dispersion liquid of polishing particles (I) was used.

TABLE 1

|  | Example No. | | | | | | Comp. Example No. | | |
| --- | --- | --- | --- | --- | --- | --- | --- | --- | --- |
|  | 1 | 2 | 3 | 4 | 5 | 6 | 1 | 2 | 3 |
| <Core particle> | | | | | | | | | |
| Component | $SiO_2$ | $SiO_2$ | $SiO_2$ | $SiO_2$ | $SiO_2$ | $TiO_2$ | $SiO_2$ | $SiO_2$ | $SiO_2$ |
| Ave. diameter (nm) | 25 | 25 | 25 | 45 | 45 | 10 | 25 | 45 | 25 |
| Density (g/cc) | 2.1 | 2.1 | 2.1 | 2.2 | 2.2 | 4.0 | 2.1 | 2.2 | 2.1 |
| Na content (ppm) | 3700 | 3700 | 3700 | 3000 | 3000 | 100 | 3700 | 3000 | 3700 |
| <Shell (silica)> | | | | | | | | | |
| Thickness (nm) | 10 | 10 | 10 | 18 | 26 | 21 | — | — | 15 |
| Density (g/cc) | 1.8 | 1.9 | 2.1 | 2.0 | 2.1 | 1.9 | — | — | 1.5 |
| Na content (ppm) | 0.01 | 0.01 | 4.3 | 0.01 | 0.01 | 0.01 | — | — | 0.01 |
| <Polishing particles> | | | | | | | | | |
| Ave. diameter (nm) | 45 | 45 | 45 | 81 | 98 | 52 | 25 | 45 | 55 |

TABLE 1-continued

| | Example No. | | | | | | Comp. Example No. | | |
|---|---|---|---|---|---|---|---|---|---|
| | 1 | 2 | 3 | 4 | 5 | 6 | 1 | 2 | 3 |
| <Assessment of polishing result> | | | | | | | | | |
| Smoothness | ◯ | ◯ | ◯ | ◯ | ◯ | ◯ | Δ | Δ | Δ |
| Polishing rate (Å/minute) | 480 | 510 | 640 | 580 | 600 | 610 | 240 | 450 | 390 |

What is claimed is:

1. Polishing particles having a core-shell structure with an average particle diameter ranging from 5 to 300 nm, said core-shell structure being formed of a core portion and a shell portion deposited on the core portion, said shell portion being formed of silica and having a thickness ranging from 1 to 50 nm.

2. The polishing particles according to claim 1, wherein said shell portion has a density ranging from 1.6 to 2.2 g/cc.

3. A polishing agent comprising the polishing particles according to claim 2.

4. The polishing particles according to claim 1, wherein said shell portion has a sodium content of not more than 10 ppm.

5. A polishing agent comprising the polishing particles according to claim 4.

6. The polishing particles according to claim 1, wherein said core portion comprises at least one, oxide selected from the group consisting of $SiO_2$, $Al_2O_3$, $ZrO_2$, $SnO_2$, $ZnO$, $CeO_2$, $TiO_2$, and $MnO$.

7. A polishing agent comprising the polishing particles according to claim 6.

8. A polishing agent comprising the polishing particles according to claim 1.

9. The polishing particles according to claim 1, wherein said core portion has an average particle diameter of 4–250 nm.

* * * * *